United States Patent
Son et al.

(10) Patent No.: US 8,158,976 B2
(45) Date of Patent: Apr. 17, 2012

(54) THIN-FILM TRANSISTOR AND METHOD OF MANUFACTURING THE SAME

(75) Inventors: Kyoung-seok Son, Seoul (KR); Jang-yeon Kwon, Seongnam-si (KR); Hyoung-sub Kim, Seoul (KR); Hoo-jeong Lee, Suwon-si (KR); Mi-ran Moon, Suwon-si (KR); Kyung Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 157 days.

(21) Appl. No.: 12/659,153

(22) Filed: Feb. 26, 2010

(65) Prior Publication Data

US 2011/0017990 A1 Jan. 27, 2011

(30) Foreign Application Priority Data

Jul. 24, 2009 (KR) .................. 10-2009-0067826

(51) Int. Cl.
*H01L 29/786* (2006.01)
(52) U.S. Cl. .................. 257/43; 257/E29.296
(58) Field of Classification Search .................. 257/43, 257/E29.296, E29.068

See application file for complete search history.

(56) References Cited

U.S. PATENT DOCUMENTS

| 2003/0211666 A1 | 11/2003 | Okumura |
| 2010/0224915 A1* | 9/2010 | Kawashima et al. .......... 257/288 |
| 2011/0095288 A1* | 4/2011 | Morosawa et al. ............. 257/43 |

FOREIGN PATENT DOCUMENTS

| JP | 05-021464 | 1/1993 |
| JP | 06-013607 | 1/1994 |
| KR | 10-0271492 | 11/2000 |
| KR | 10-2006-0103241 | 9/2006 |
| KR | 10-0736360 | 7/2007 |
| KR | 10-0795012 | 1/2008 |

* cited by examiner

*Primary Examiner* — Cuong Q Nguyen
*Assistant Examiner* — Tran Tran
(74) *Attorney, Agent, or Firm* — Harness, Dickey & Pierce, P.L.C.

(57) ABSTRACT

Example embodiments relate to thin-film transistors (TFT) and methods for fabricating the same. A thin-film transistor according to example embodiments may include a gate, a gate insulation layer, a channel layer including a first oxide semiconductor layer and a second oxide semiconductor layer, and a source and drain on opposite sides of the channel layer. The first oxide semiconductor layer may have relatively large crystal grains compared to the second oxide semiconductor layer.

17 Claims, 9 Drawing Sheets

THIN-FILM TRANSISTOR AND METHOD OF MANUFACTURING THE SAME

CROSS-REFERENCE TO RELATED APPLICATION

This application claims priority under 35 U.S.C. §119 to Korean Patent Application No. 10-2009-0067826, filed on Jul. 24, 2009 with the Korean Intellectual Property Office, the entire contents of which are incorporated herein in by reference.

BACKGROUND

1. Field

The present disclosure relates to thin-film transistors (TFTs) that may be used as a more efficient switching device and methods of manufacturing the TFTs.

2. Description of the Related Art

Thin-film transistors (TFT) are utilized in various fields and are frequently used as switching devices and driving devices in display apparatuses. TFT performance may be significantly affected by characteristics of the material constituting a channel layer, through which charge carriers move. Thus, TFTs made of various materials are being developed and analyzed. Examples of TFTs used as switching devices and driving devices in display apparatuses include an amorphous silicon TFT (a-Si TFT), a poly-crystal silicon TFT (poly-Si TFT), and an oxide TFT.

An a-Si TFT is the most commonly used TFT in display apparatuses, because an a-Si TFT may be uniformly formed on a relatively large substrate of over 2 meters with relatively low cost. However, as display apparatuses become larger and have higher resolutions, higher performance is being demanded of TFTs. Thus, attempts have been made to use materials having higher levels of mobility as channel layers.

A poly-Si TFT is significantly more efficient than a-Si TFT and has higher mobility (e.g., from about dozens of $cm^2/Vs$ to hundreds of $cm^2/Vs$). Thus, a poly-Si TFT is efficient enough to be used for a higher resolution display apparatus. However, the fabrication of a poly-Si TFT requires relatively complex operations and additional costs as compared to the fabrication of an a-Si TFT. In addition, uniformity of poly-Si TFT decreases when a poly-Si TFT is applied to a relatively large substrate.

On the other hand, an oxide TFT has advantages of both an a-Si TFT and a poly-Si TFT. As a result, there has been an increased focus on developing oxide TFTs. In addition to an oxide TFT exhibiting relatively high mobility characteristics, a channel layer thereof may be formed by using a direct deposition method instead of using laser. Thus, even when an oxide TFT is applied to a relatively large area substrate, satisfactory performance may be expected.

SUMMARY

Example embodiments relate to thin-film transistors (TFT) as more efficient switching devices and methods of manufacturing the TFT. A thin-film transistor (TFT) according to example embodiments may include a gate; a gate insulation layer; a channel layer including a first oxide semiconductor layer and a second oxide semiconductor layer; and a source and drain on opposite sides of the channel layer, wherein the first oxide semiconductor layer has larger crystal grains than the second oxide semiconductor layer. The first oxide semiconductor layer may be closer to the gate than the second oxide semiconductor layer. The TFT may have a bottom gate structure. Alternatively, the TFT may have a top gate structure. With a top gate structure, the source and drain may be self-aligned with the gate. The thickness of the second oxide semiconductor layer may be greater than that of the first oxide semiconductor layer. The thickness of the first oxide semiconductor layer may be from about 10 nm to about 200 nm, and the thickness of the second oxide semiconductor layer may be from about 15 nm to about 300 nm. Crystal grain sizes of the first and second oxide semiconductor layers may be controlled by deposition power. Each of the first and second oxide semiconductor layers may be formed of at least one material selected from the group consisting of $ZnO$, $In_2O_3$, $Ga_2O_3$, $SnO$, IZO, ITO, GIZO, and hfInZnO.

A method of fabricating a thin-film transistor (TFT) may include forming a gate; forming a first oxide semiconductor layer of a crystalline material; forming a second oxide semiconductor layer having smaller crystal grains than the first oxide semiconductor layer, the first and second oxide semiconductor layers constituting a channel layer; and forming a source and drain on opposite sides of the channel layer. The channel layer may be formed such that the first oxide semiconductor layer is disposed closer to the gate than the second oxide semiconductor layer. The deposition power for forming the first oxide semiconductor layer and the deposition power for forming the second oxide semiconductor layer may be different. For example, the deposition power for forming the second oxide semiconductor layer may be greater than the deposition power for forming the first oxide semiconductor layer.

BRIEF DESCRIPTION OF THE DRAWINGS

The above and/or other aspects of example embodiments may become more apparent and readily appreciated when the detailed description is taken in conjunction with the accompanying drawings of which.

DETAILED DESCRIPTION

It will be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "comprises" "comprising", "includes" and/or "including" when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 1:
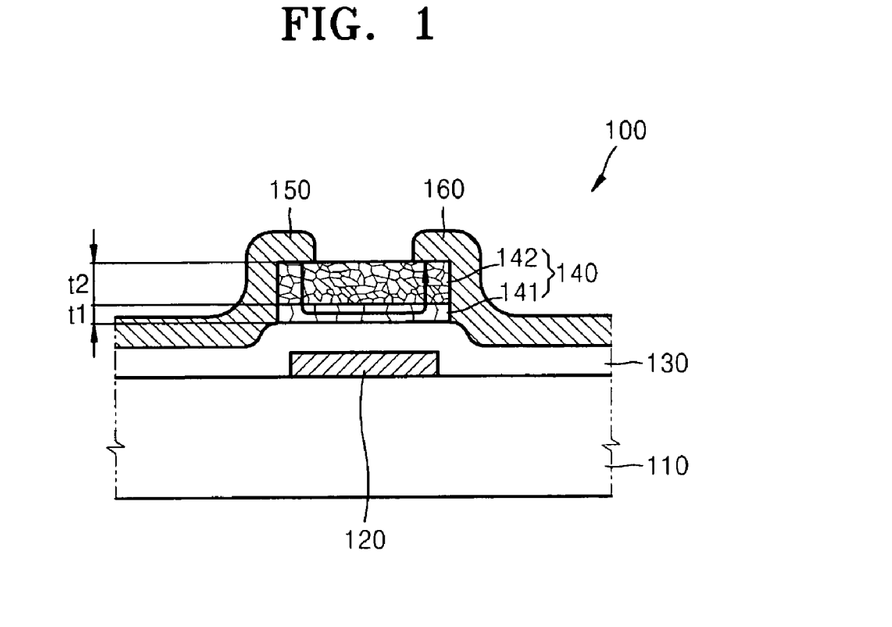
FIG. 1 is a schematic view of a thin-film transistor (TFT) according to embodiments.

FIG. 1 is a schematic view of a thin-film transistor (TFT) 100 according to example embodiments. Referring to FIG. 1, the TFT 100 may include a gate 120, a gate insulation layer 130, a channel layer 140, and a source 150 and a drain 160 that are respectively formed on two opposite sides of the channel layer 140. The channel layer 140 may include multiple layers, e.g., a first oxide semiconductor layer 141 and a second oxide semiconductor layer 142 having crystal grains of different sizes.

The crystal grains of the first oxide semiconductor layer 141 may be larger than the crystal grains of the second oxide semiconductor layer 142. The channel layer 140 may be formed in this manner in consideration of mobility when a channel is ON and in consideration of leakage current when a channel is OFF. Crystal grain size affects diffusion between grain boundaries and, thus, may affect mobility and leakage current. When grain size is relatively large, diffusion between grain boundaries may be less likely to occur and, thus, electrons may move more easily. This characteristic is exhibited by the fact that mobility is relatively high when a channel is ON and leakage current is relatively high when a channel is OFF. Stated more clearly, larger crystal grain size may be better for mobility, whereas smaller crystal grain size may be better for leakage current reduction.

Because higher mobility and lower leakage current are necessary for a more efficient switching device, it is necessary to determine a suitable crystal grain size when the channel layer 140 is formed. Considering a current path when a channel is ON, the first oxide semiconductor layer 141 (which may be disposed closer to the gate 120 than the second oxide semiconductor layer 142 and may be used as the main current path) may have relatively large crystal grains, whereas the second oxide semiconductor layer 142 (which is less often used as the current path) may have relatively small crystal grains. The purpose of the configuration is to increase mobility and reduce leakage current. Thus, a thickness t2 of the second oxide semiconductor layer 142 may be greater than a thickness t1 of the first oxide semiconductor layer 141. Because a current path may be relatively close to the gate 120, by forming the first oxide semiconductor layer 141 (which has relatively large crystal grains) to have the thickness t1 within a range of thicknesses with which a current path may be secured and forming the second oxide semiconductor layer 142 to have a relatively greater thickness t2, leakage current may be reduced and mobility may be increased in a relatively efficient manner.

The thickness t1 of the first oxide semiconductor layer 141 may be such so as to be sufficient to form a current path. For example, the thickness t1 of the first oxide semiconductor layer 141 may be from about 10 nm to about 200 nm, whereas the thickness t2 of the second oxide semiconductor layer 142 may be from about 15 nm to about 300 nm. The size of crystal grains may be controlled by adjusting the deposition power for depositing an oxide semiconductor material, wherein, in cases of a material such as crystalline ZnO, deposition power is inversely proportional to the size of crystal grains. Herein, deposition power means the amount of power used in deposition.

Materials for forming the TFT 100 will be described below in further detail. A substrate 110 may be formed of a material used for forming a general semiconductor substrate, e.g., silicon (Si), glass, or an organic material. The gate 120 has voltages applied thereto for turning the TFT 100 ON/OFF and may be formed of a conductive material, e.g., a metal or a metallic or conductive oxide. The metal may be, for example, platinum (Pt), ruthenium (Ru), gold (Au), silver (Ag), molybdenum (Mo), aluminium (Al), tungsten (W), or copper (Cu).

The metallic or conductive oxide may be IZO (InZnO) or AZO (AlZnO). The gate insulation layer 130 may be formed using an insulation material used in a general semiconductor device and may be a silicon oxide ($SiO_2$). Alternatively, silicon nitride ($Si_3N_4$), $HfO_2$, $Al_2O_3$ (which are higher-k materials having higher permittivity than $SiO_2$), or a combination thereof may be used. For example, the gate insulation layer 130 may be a double-layer formed of such materials.

The first oxide semiconductor layer 141 and the second oxide semiconductor layer 142, which constitute the channel layer 140, may be formed of an oxide semiconductor material. The oxide semiconductor material may be a crystalline oxide semiconductor material. For example, each of the oxide semiconductor layers 141 and 142 may be formed of ZnO, $In_2O_3$, $Ga_2O_3$, SnO, In—Zn Oxide (IZO), In-Tin Oxide (ITO), Ga—In—Zn Oxide (GIZO), or HfInZnO, wherein Al, nickel (Ni), Cu, tantalum (Ta), hafnium (Hf), or titanium (Ti) may be doped into the material. However, it should be understood that oxide semiconductor materials for forming the oxide semiconductor layers 141 and 142 are not limited thereto. The source 150 and the drain 160 may be formed of a conductive material. The conductive material may be a metal (e.g., Pt, Ru, Au, Ag, Mo, Al, W, or Cu) or a metallic or conductive oxide (e.g., IZO (InZnO) or AZO (AlZnO)).

Figure 2:
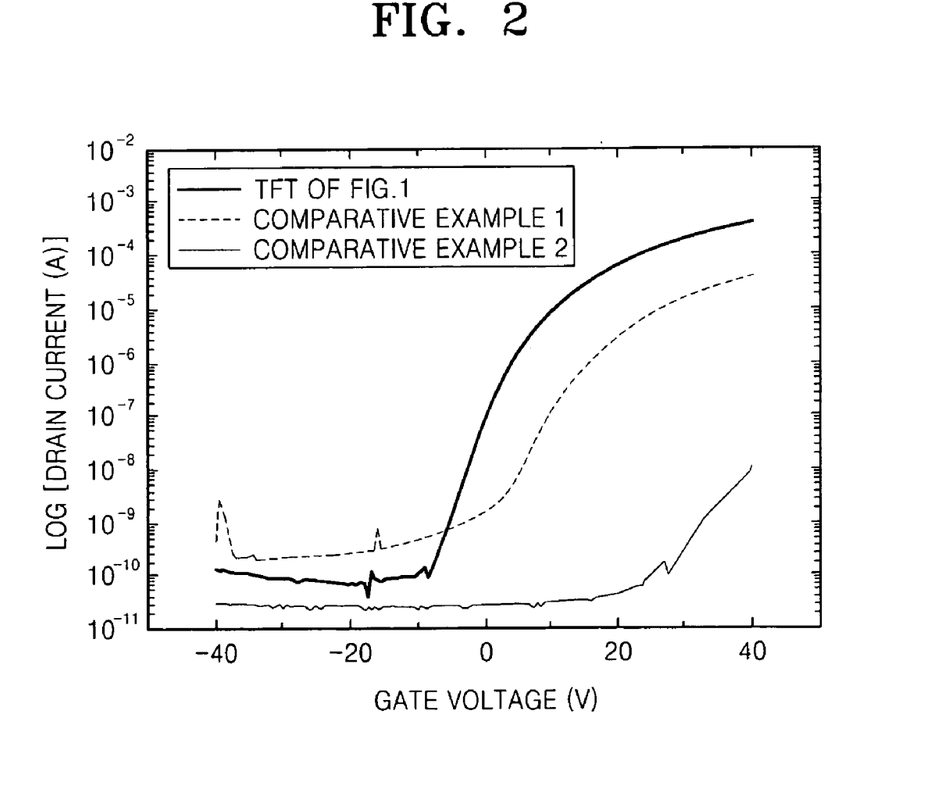
FIG. 2 is a graph showing the switching efficiency of the TFT of FIG. 1 compared to the TFTs according to comparative examples.

FIG. 2 is a graph showing the switching efficiency of the TFT of FIG. 1 compared to TFTs according to first and second comparative examples. Each of the TFT of FIG. 1 and the TFTs according to the comparative examples have channel layers that are formed of crystalline ZnO and have a thickness of 100 nm. In the first comparative example, the deposition power is set to 500 W, and crystal grains are formed to have a relatively small size. In the second comparative example, the deposition power is set to 50 W, and crystal grains are formed to have a relatively large size. In the TFT of FIG. 1, using a deposition power of 50 W, the thickness t1 of the first oxide semiconductor layer 141 (which has relatively large crystal grains) is formed as 40 nm, and using a deposition power of 500 W, the thickness t2 of the second oxide semiconductor layer 142 (which has relatively small crystal grains) is formed as 60 nm. Referring to FIG. 2, the TFT according to the first comparative example exhibits relatively high leakage current and relatively high mobility, and the TFT according to the second comparative example exhibits relatively low leakage current and relatively low mobility. However, the TFT of FIG. 1 exhibits relatively high mobility and relatively low leakage current. Thus, the TFT of FIG. 1 exhibits improved switching efficiency. Table 1 shows comparisons between switching characteristics of the TFT of FIG. 1 and those of the TFTs according to the comparative examples.

TABLE 1

|  | Threshold Voltage (V) | Mobility ($cm^2/V \cdot s$) | S.S (V/decade) | Current ON/OFF Ratio |
|---|---|---|---|---|
| Comparative Example 1 | 15.8 | 4.6 | 3.03 | ~$10^4$ |
| TFT of FIG. 1 | 6.4 | 19.04 | 2.6 | Equal To Or Greater Than $10^6$ |
| Comparative Example 2 | 33.8 | Less Than Or Equal To 0.1 | — | ~$10^2$ |

As shown in Table 1, the TFT of FIG. 1 exhibits the lowest threshold voltage, the highest mobility, a relatively low sub-threshold slope (S.S), and a relatively high current ON/OFF ratio. Thus, the TFT of FIG. 1 exhibits improved switching characteristics.

Figure 3:
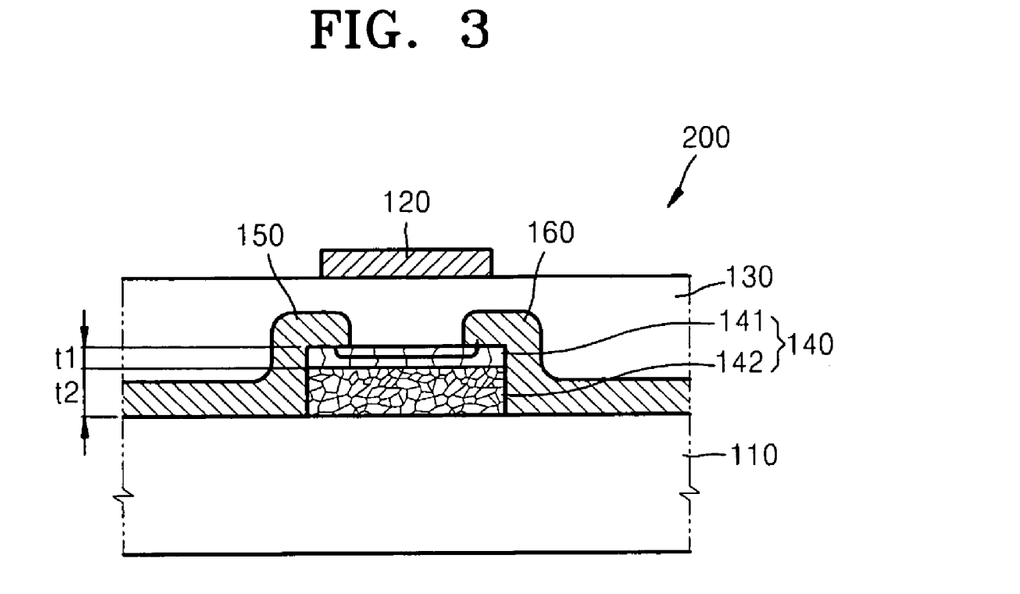
FIG. 3 is a schematic view of another TFT according to example embodiments.

FIG. 3 is a schematic view of a TFT 200 according to example embodiments. In the TFT 200, the channel layer 140, which includes the second oxide semiconductor layer 142 and the first oxide semiconductor layer 141, is formed on the substrate 110. The source 150 and the drain 160 may be formed so as to respectively contact two opposite sides of the channel layer 140. The gate insulation layer 130 and the gate 120 may be formed on the channel layer 140. Compared to the TFT 100 of FIG. 1, the location of the gate 120 is different in the TFT 200. Stated more clearly, the TFT 100 of FIG. 1 has a bottom gate structure, whereas the TFT 200 of FIG. 2 has a top gate structure. Thus, the first oxide semiconductor layer 141 having relatively large crystal grains is formed on the second oxide semiconductor layer 142 having relatively small crystal grains, such that the first oxide semiconductor layer 141 having the relatively large crystal grains is disposed closer to the gate 120.

The thickness t1 of the first oxide semiconductor layer 141 may be greater than about 10 nm in consideration of a current path when a channel is ON. Furthermore, the thickness t2 of the second oxide semiconductor layer 142 may be greater than the thickness t1 of the first oxide semiconductor layer 141 to reduce leakage current when a channel is OFF. For example, the thickness t1 of the first oxide semiconductor layer 141 may be from about 10 nm to about 200 nm, whereas the thickness t2 of the second oxide semiconductor layer 142 may be from about 15 nm to about 300 nm.

Figure 4:
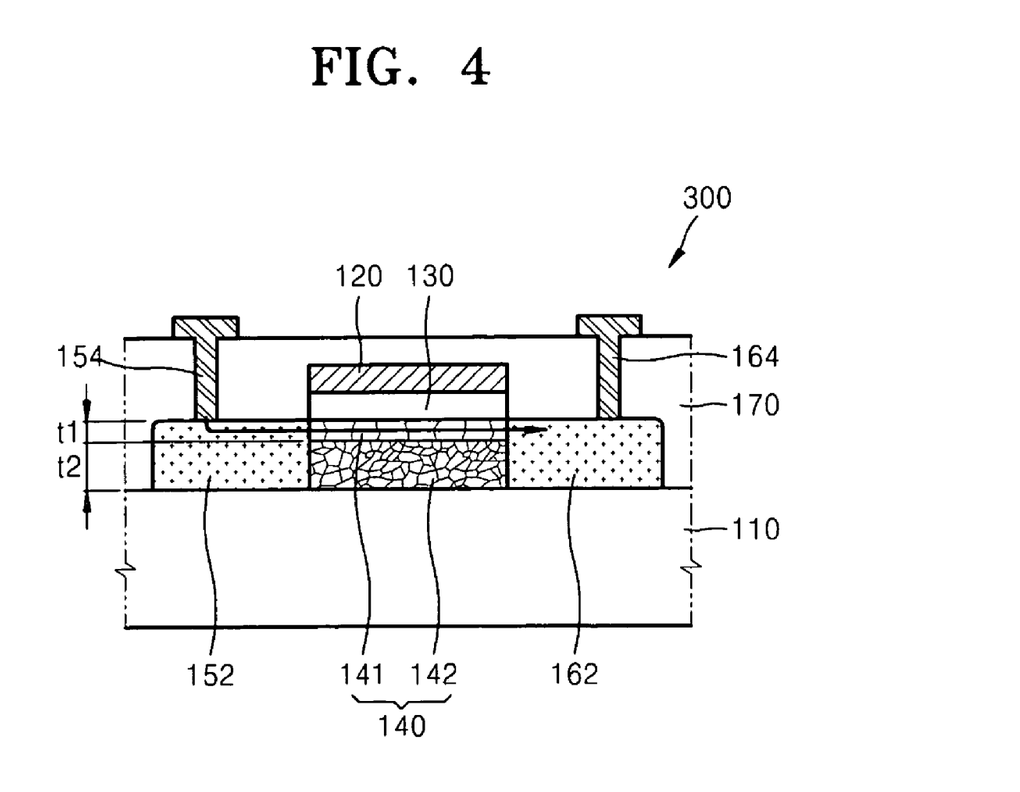
FIG. 4 is a schematic view of another TFT according to example embodiments.

FIG. 4 is a schematic view of a TFT 300 according to example embodiments. The TFT 300 has a self-aligned top gate structure. A source region 152 and a drain region 162 may be respectively disposed at two opposite sides of the channel layer 140 and may be self-aligned according to the location of the gate 120, such that the source region 152 and the drain region 162 do not overlap with the gate 120. Because the gate insulation layer 130 and the gate 120 are disposed on the channel layer 140, a double-layer constituting the channel layer 140 may have a structure in which the first oxide semiconductor layer 141 having relatively large crystal grains is disposed on the second oxide semiconductor layer 142 having relatively small crystal grains.

The thickness t1 of the first oxide semiconductor layer 141 may be greater than about 10 nm, and the thickness t2 of the second oxide semiconductor layer 142 may be greater than the thickness t1 of the first oxide semiconductor layer 141. For example, the thickness t1 of the first oxide semiconductor layer 141 may be from about 10 nm to about 200 nm, whereas the thickness t2 of the second oxide semiconductor layer 142 may be from about 15 nm to about 300 nm. The source region 152 and the drain region 162 may be respectively connected to a source electrode 154 and a drain electrode 164 penetrating a passivation layer 170.

Because a TFT according to example embodiments may include a channel layer formed of multi-layers having crystal grains of different sizes, mobility may be increased and leakage current may be reduced at the same time. Thus, a TFT according to example embodiments exhibits improved switching characteristics.

Figure 5A:
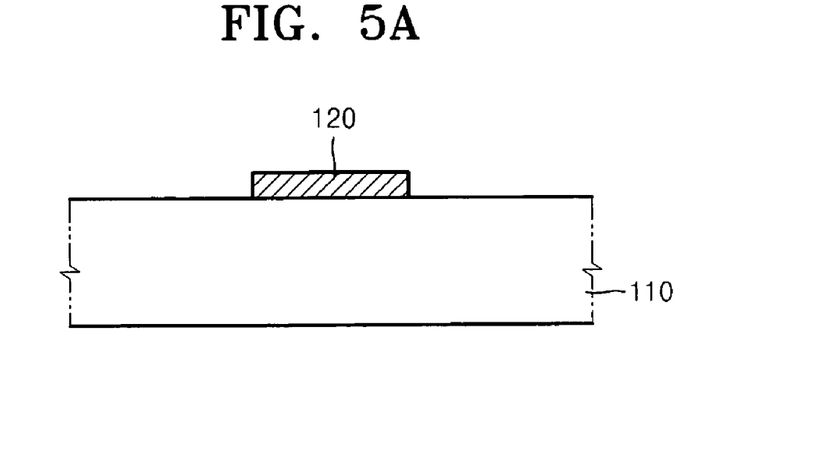
FIGS. 5A through 5F are diagrams showing a method of fabricating the TFT of FIG. 1.

FIGS. 5A through 5F are diagrams showing a method of fabricating the TFT of FIG. 1. Referring to FIG. 5A, the substrate 110 is prepared, and the gate 120 is formed on the substrate 110. A silicon substrate may be used as the substrate 110, although example embodiments are not limited thereto. For instance, a glass substrate, plastic substrate, or other suitable substrate may also be used. The gate 120 may be formed by depositing a metallic material onto the substrate 110 and patterning the deposited metallic material.

Figure 5B:
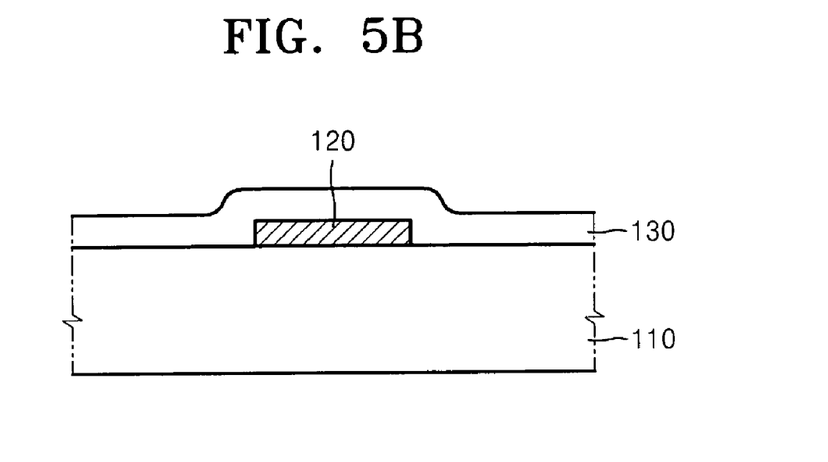

Referring to FIG. 5B, a gate insulation layer 130 is formed on the substrate 110 so as to cover the gate 120. The gate insulation layer 130 may be a silicon oxide or a silicon nitride, although example embodiments are not limited thereto.

Figure 5C:
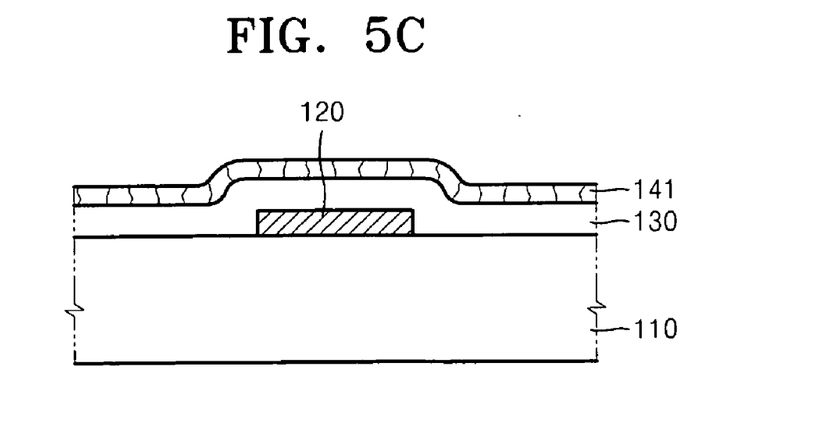
Figure 5D:
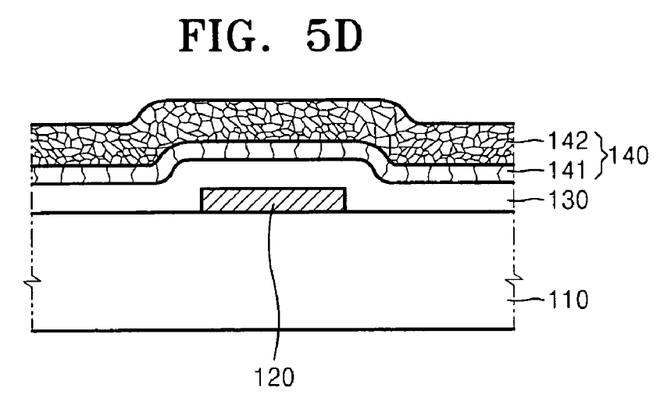
Figure 5E:
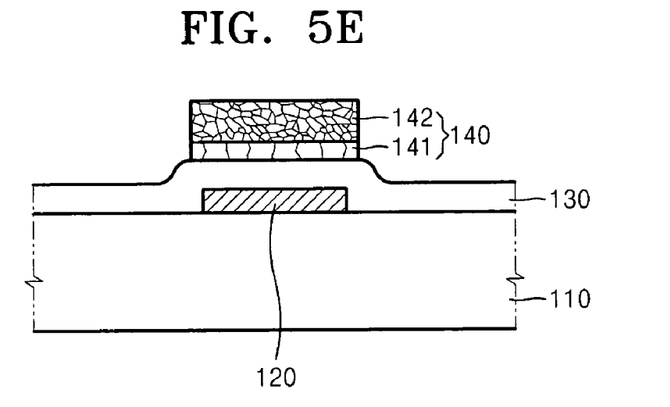

FIGS. 5C through 5E show operations of forming the channel layer 140 on the gate insulation layer 130 so as to correspond to the gate 120. Referring to FIG. 5C, the first oxide semiconductor layer 141 is formed. The first oxide semiconductor layer 141 may be formed by using a physical vapor deposition method, e.g., sputtering or evaporation. The first oxide semiconductor layer 141 may be the layer disposed the closest to the gate 120 from among the multiple layers constituting the channel layer 140. Thus, the first oxide semiconductor layer 141 may be formed to have relatively large crystal grains for increased mobility. The size of crystal grains may be controlled by adjusting the deposition power for depositing an oxide semiconductor material. The thickness of the first oxide semiconductor layer 141 may be sufficient to form a current path, e.g., thickness of about 10 nm or more. For example, the thickness t1 of the first oxide semiconductor layer 141 may be from about 10 nm to about 200 nm.

Referring to FIG. 5D, the second oxide semiconductor layer 142 is formed. The thickness of the second oxide semiconductor layer 142 may be from about 15 nm to about 300 nm. By adjusting deposition power, the second oxide semiconductor layer 142 may be formed to have relatively small crystal grains compared to the first oxide semiconductor layer 141. The degree of adjustments to the deposition power varies according to the materials to be deposited. For example, when forming the channel layer 140 using crystalline ZnO, the size of the crystal grains may be reduced by increasing deposition power. An oxide semiconductor material for forming the channel layer 140 may be, for example, ZnO, $In_2O_3$, $Ga_2O_3$, SnO, IZO, ITO, GIZO, or HfInZnO, wherein Al, Ni, Cu, Ta, Hf, or Ti may be doped into the material. However, it should be understood that oxide semiconductor materials for forming the channel layer 140 are not limited thereto.

Figure 5F:
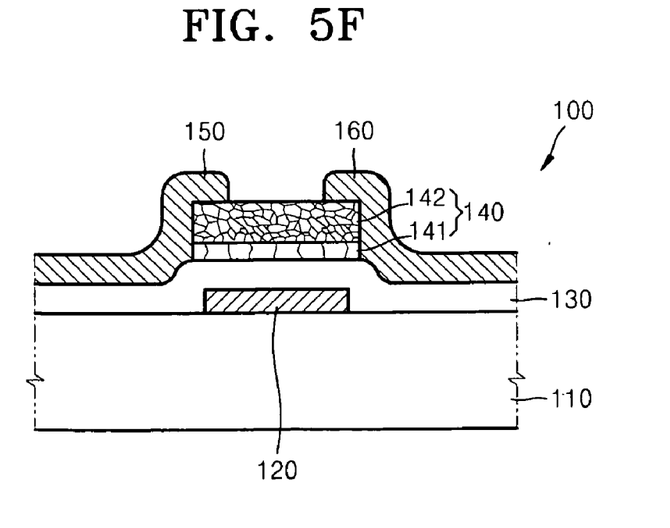

Referring to FIG. 5E, the channel layer 140 is patterned to correspond to the gate 120. Referring to FIG. 5F, the source 150 and the drain 160 are formed such that the source 150 and the drain 160 respectively contact two opposite sides of the channel layer 140. The source 150 and the drain 160 may be formed by forming a conductive material layer so as to cover the channel layer 140 and patterning the conductive material layer. The conductive material layer may be formed of a metal (e.g., Pt, Ru, Au, Ag, Mo, Al, W, or Cu) or a metallic or conductive oxide (e.g., IZO or AZO). However, it should be understood that materials for forming the conductive material layer are not limited thereto. A plasma operation for supplying oxygen to the channel layer 140 may also be performed prior to the formation of the source 150 and the drain 160. The formation and heat treatment of a passivation layer (not shown) for protecting the channel layer 140 may further be performed. Accordingly, the TFT 100 including the channel layer 140, which includes two layers having crystal grains of different sizes, may be fabricated.

Figure 6A:
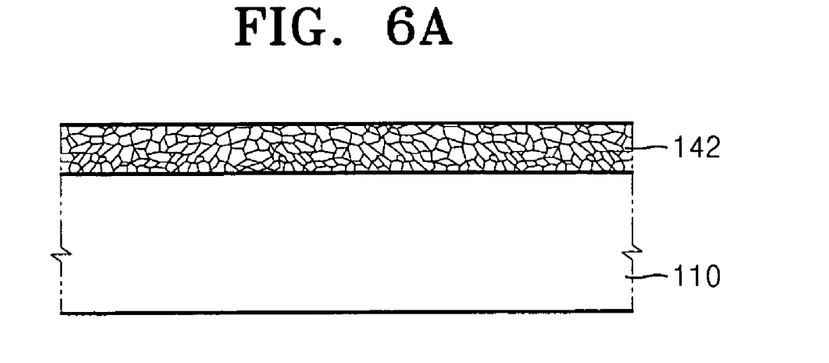
FIGS. 6A through 6E are diagrams showing a method of fabricating the TFT of FIG. 3.

FIGS. 6A through 6E are diagrams showing a method of fabricating the TFT of FIG. 3. Referring to FIG. 6A, the substrate 110 is prepared, and the second oxide semiconductor layer 142 is formed on the substrate 110. Because the TFT will have a top gate structure, the second oxide semiconductor layer 142 having relatively small crystal grains is formed first.

Figure 6B:
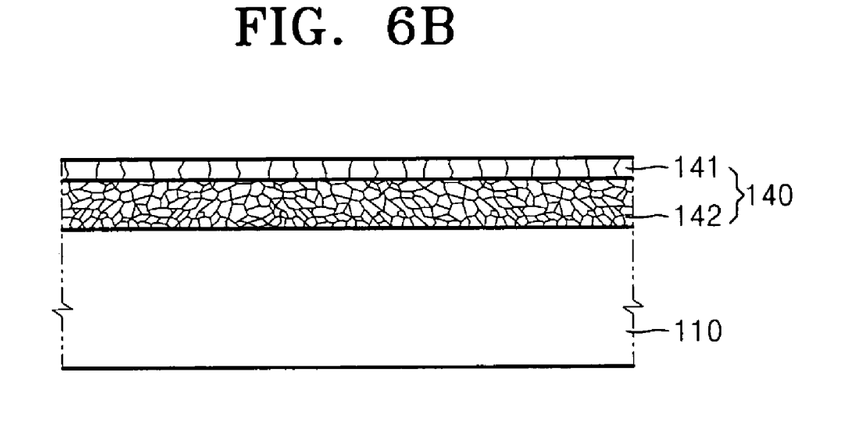

Referring to FIG. 6B, the first oxide semiconductor layer 141 is formed on the second oxide semiconductor layer 142 to form the channel layer 140. The first oxide semiconductor layer 141 may be formed to have relatively large crystal grains compared to the second oxide semiconductor layer 142. The deposition power for forming the first oxide semiconductor layer 141 may be adjusted to be lower than deposition power for forming the second oxide semiconductor layer 142. The thickness of the first oxide semiconductor layer 141 may be smaller than that of the second oxide semiconductor layer 142. In a non-limiting embodiment, the thickness of the first oxide semiconductor layer 141 may be equal to or greater than about 10 nm to form a current path. For example, the thickness of the first oxide semiconductor layer 141 may be from about 10 nm to about 200 nm, whereas the thickness of the second oxide semiconductor layer 142 may be from about 15 nm to about 300 nm.

Figure 6C:
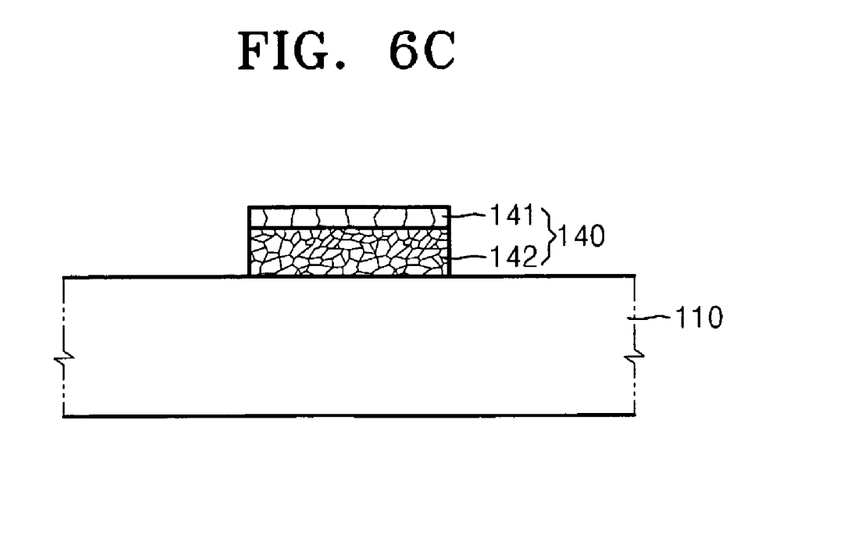
Figure 6D:
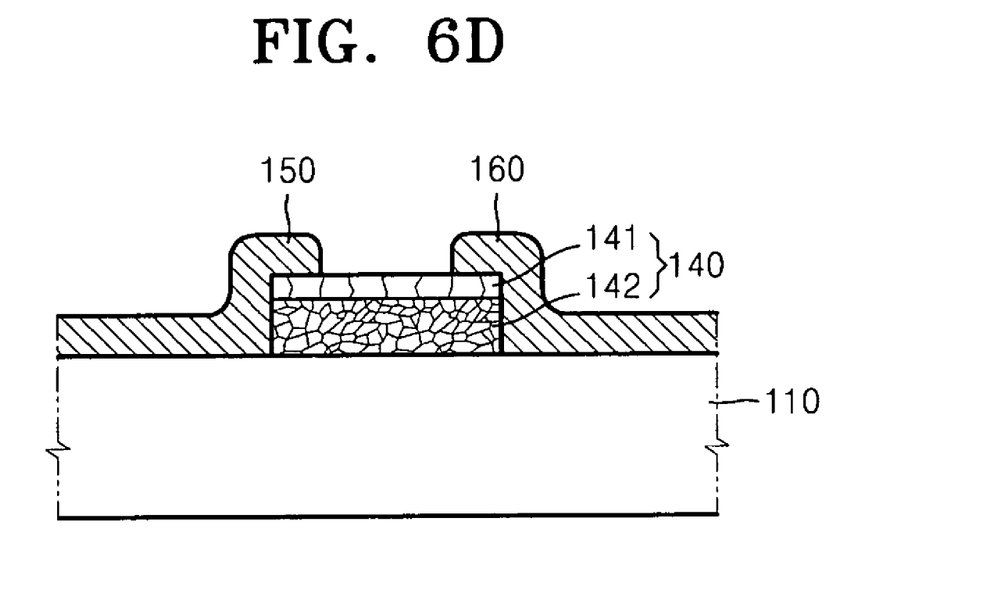
Figure 6E:
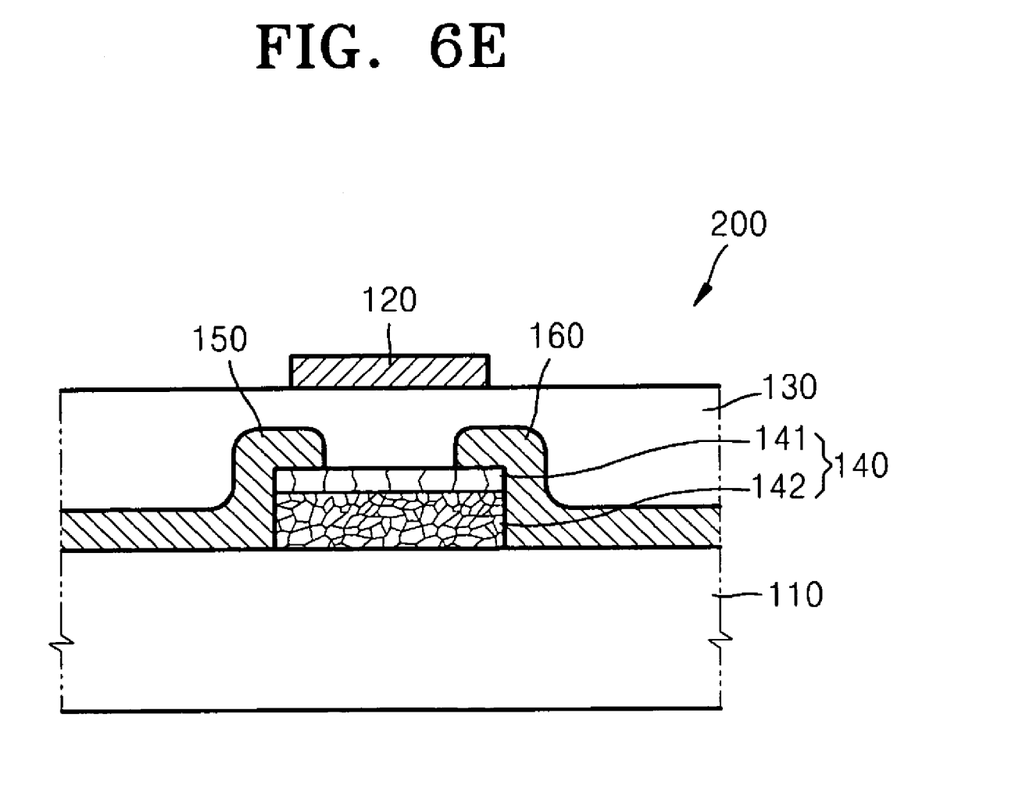

Referring to FIG. 6C, the channel layer 140 is patterned. Referring to FIG. 6D, the source 150 and the drain 160 are formed so as to respectively contact two opposite sides of the channel layer 140. Referring to FIG. 6E, the gate insulation layer 130 and the gate 120 are sequentially formed. As a result, the TFT 200 is fabricated.

Figure 7A:
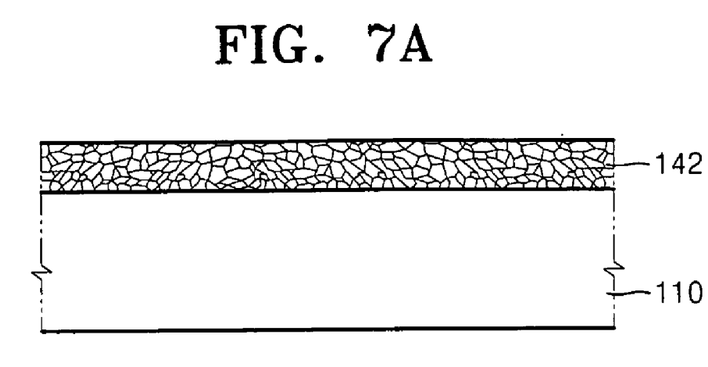
FIGS. 7A through 7G are diagrams showing a method of fabricating the TFT of FIG. 4.

FIGS. 7A through 7G are diagrams showing a method of fabricating the TFT of FIG. 4. Referring to FIG. 7A, the substrate 110 is prepared, and the second oxide semiconductor layer 142 is formed on the substrate 110. Because the TFT will have a self-aligned top gate structure, the second oxide semiconductor layer 142 having relatively small crystal grains is formed first.

Figure 7B:
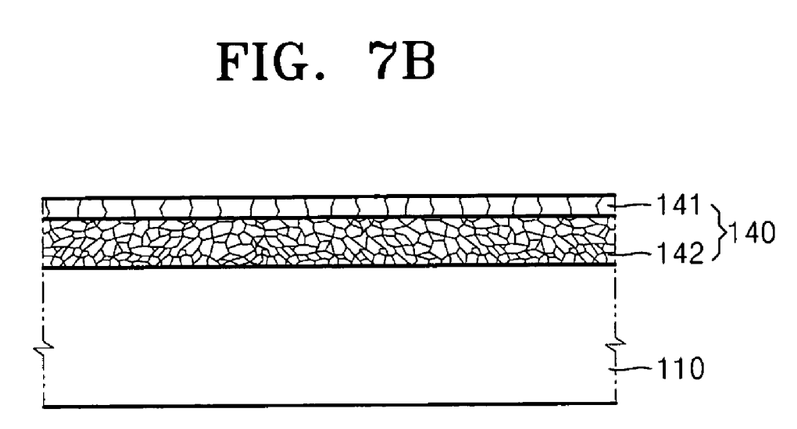

Referring to FIG. 7B, the first oxide semiconductor layer 141 is formed on the second oxide semiconductor layer 142 to form the channel layer 140. The first oxide semiconductor layer 141 may be formed to have relatively large crystal grains compared to the second oxide semiconductor layer 142. The deposition power for forming the first oxide semiconductor layer 141 may be adjusted to be lower than deposition power for forming the second oxide semiconductor layer 142. The thickness of the first oxide semiconductor layer 141 may be smaller than that of the second oxide semiconductor layer 142. In a non-limiting embodiment, the thickness of the first oxide semiconductor layer 141 may be equal to or greater than about 10 nm to form a current path. For example, the thickness of the first oxide semiconductor layer 141 may be from about 10 nm to about 200 nm, whereas the thickness of the second oxide semiconductor layer 142 may be from about 15 nm to about 300 nm.

Figure 7C:
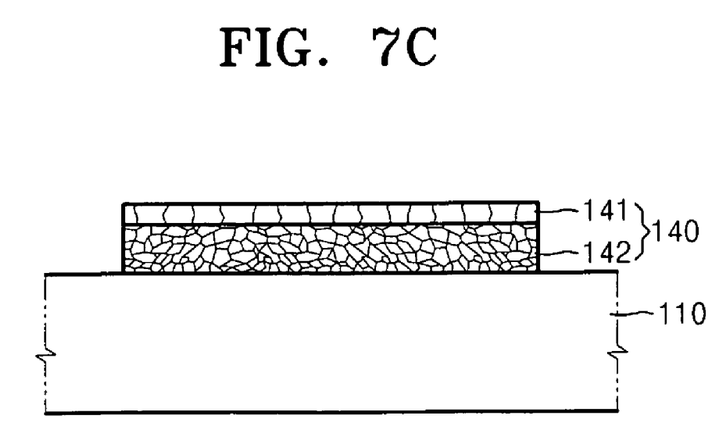
Figure 7D:
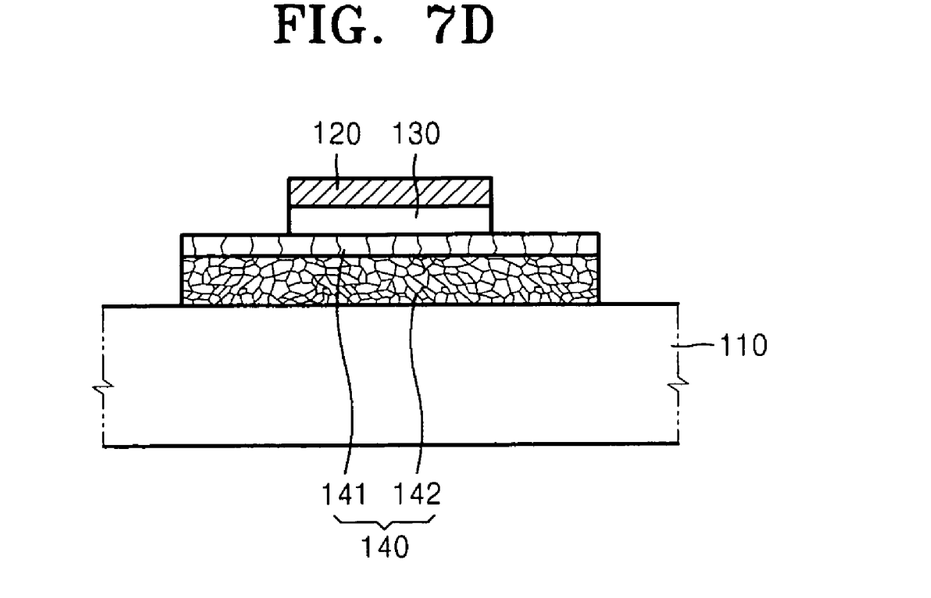
Figure 7E:
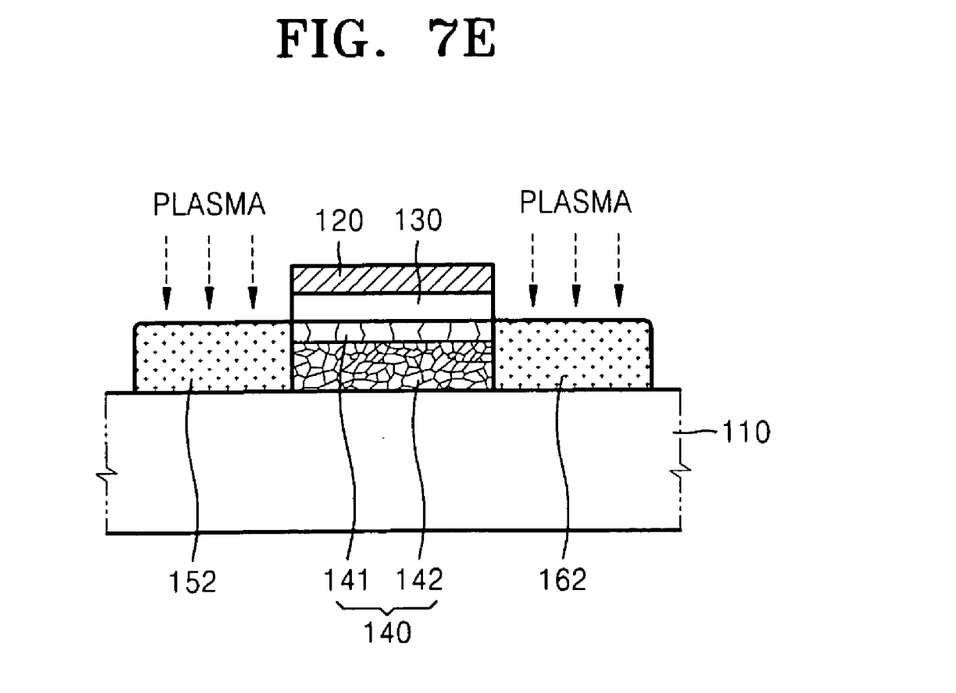
Figure 7F:
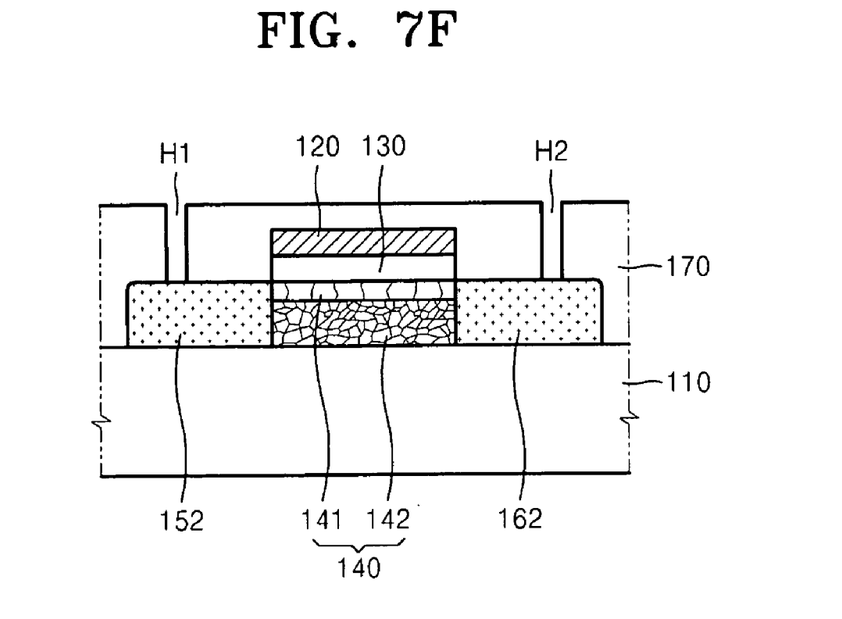
Figure 7G:
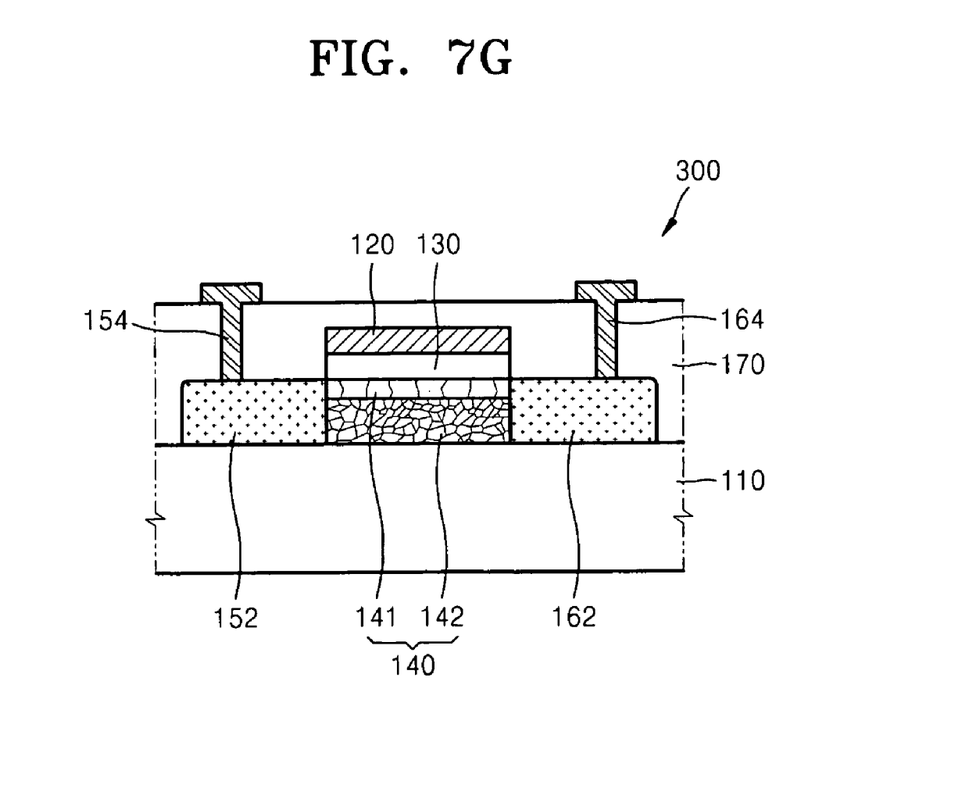

Referring to FIG. 7C, the channel layer 140 is patterned. Referring to FIG. 7D, the gate insulation layer 130 and the gate 120 are sequentially formed to have predetermined widths. Referring to FIG. 7E, two opposite ends of the channel layer 140 may be plasma processed. The regions in which the conductivities are increased by the plasma processing may become the source region 152 and the drain region 162. The plasma processing may be performed by using the gate 120 as a mask. Thus, the source region 152 and the drain region 162 do not overlap with the gate 120. Referring to FIG. 7F, the passivation layer 170 and contact holes H1 and H2 may be formed to expose portions of the source region 152 and the drain region 162, respectively. Referring to FIG. 7G, the source electrode 154 and the drain electrode 164 are formed. As a result, the TFT 300 is fabricated.

As described above according to example embodiments, crystal grain sizes may be controlled by adjusting the deposition power for forming the oxide semiconductor layers. Thus, a TFT having improved switching characteristics may be fabricated.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

The invention claimed is:

1. A thin-film transistor comprising:
   a gate;
   a gate insulation layer;
   a channel layer including a first oxide semiconductor layer and a second oxide semiconductor layer; and
   a source and drain on opposite sides of the channel layer,
   wherein the first oxide semiconductor layer has larger crystal grains than the second oxide semiconductor layer.

2. The thin-film transistor of claim 1, wherein the first oxide semiconductor layer is closer to the gate than the second oxide semiconductor layer.

3. The thin-film transistor of claim 2, wherein the thin-film transistor has a bottom gate structure.

4. The thin-film transistor of claim 2, wherein the thin-film transistor has a top gate structure.

5. The thin-film transistor of claim 4, wherein the source and drain are self-aligned with the gate.

6. The thin-film transistor of claim 1, wherein a thickness of the second oxide semiconductor layer is greater than that of the first oxide semiconductor layer.

7. The thin-film transistor of claim 6, wherein
   the thickness of the first oxide semiconductor layer is from about 10 nm to about 200 nm, and
   the thickness of the second oxide semiconductor layer is from about 15 nm to about 300 nm.

8. The thin-film transistor of claim 1, wherein crystal grain sizes of the first and second oxide semiconductor layers are controlled by deposition power.

9. The thin-film transistor of claim 8, wherein each of the first and second oxide semiconductor layers are formed of at least one material selected from the group consisting of ZnO, $In_2O_3$, $Ga_2O_3$, SnO, IZO, ITO, GIZO, and HfInZnO.

10. The thin-film transistor of claim 1, wherein the first and second oxide semiconductor layers are formed of crystalline ZnO.

11. A method of fabricating a thin-film transistor, comprising:
    forming a gate;
    forming a first oxide semiconductor layer of a crystalline material;
    forming a second oxide semiconductor layer having smaller crystal grains than the first oxide semiconductor layer, the first and second oxide semiconductor layers constituting a channel layer; and
    forming a source and drain on opposite sides of the channel layer.

12. The method of claim 11, wherein the channel layer is formed such that the first oxide semiconductor layer is disposed closer to the gate than the second oxide semiconductor layer.

13. The method of claim 12, wherein a deposition power for forming the first oxide semiconductor layer and a deposition power for forming the second oxide semiconductor layer are different.

14. The method of claim 13, wherein the deposition power for forming the second oxide semiconductor layer is greater than the deposition power for forming the first oxide semiconductor layer.

15. The method of claim 11, wherein
    a thickness of the first oxide semiconductor layer is from about 10 nm to about 200 nm, and
    a thickness of the second oxide semiconductor layer is from about 15 nm to about 300 nm.

16. The method of claim 11, wherein each of the first and second oxide semiconductor layers are formed of at least one material selected from the group consisting of ZnO, $In_2O_3$, $Ga_2O_3$, SnO, IZO, ITO, GIZO, and HfInZnO.

17. The method of claim 11, wherein the first and second oxide semiconductor layers are formed of crystalline ZnO.

* * * * *